(12) United States Patent
Chiu et al.

(10) Patent No.: US 12,009,239 B2
(45) Date of Patent: Jun. 11, 2024

(54) QUICK-DETACHABLE VALVE, SUBSTRATE CONTAINER PROVIDED WITH THE SAME, AND METHOD OF LOADING AND UNLOADING THE SAME

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Hsin-Min Hsueh, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 317 days.

(21) Appl. No.: 17/695,004

(22) Filed: Mar. 15, 2022

(65) Prior Publication Data
US 2023/0065892 A1     Mar. 2, 2023

(30) Foreign Application Priority Data

Sep. 2, 2021   (TW) ................................. 110132649

(51) Int. Cl.
*F16K 27/02* (2006.01)
*G03F 1/66* (2012.01)
*H01L 21/673* (2006.01)

(52) U.S. Cl.
CPC .... *H01L 21/67389* (2013.01); *F16K 27/0209* (2013.01); *G03F 1/66* (2013.01); *H01L 21/67359* (2013.01); *F16K 2200/50* (2021.08)

(58) Field of Classification Search
CPC ...... F16K 15/026; F16K 15/065; F16K 24/04; F16K 27/0209; F16K 2200/50; H01L 21/67389; H01L 21/67359; G03F 1/66
See application file for complete search history.

(56) References Cited

U.S. PATENT DOCUMENTS

| | | | |
|---|---|---|---|
| 6,732,877 B2 * | 5/2004 | Wu | B65D 51/1616 220/300 |
| 2015/0166228 A1 * | 6/2015 | Aljajawi | F16K 27/0209 220/203.28 |
| 2018/0238458 A1 * | 8/2018 | Vallee | F01P 11/08 |

* cited by examiner

*Primary Examiner* — P. Macade Nichols
(74) *Attorney, Agent, or Firm* — Locke Lord LLP; Tim Tingkang Xia, Esq.

(57) ABSTRACT

Provided is a quick-release valve including: a quick-release member having a collar detachably coupled to a bottom opening of a base; and a sleeve having a flow passage for allowing a gas to enter or exit a substrate container. The collar has a pair of ear portions extending outward therefrom along a diameter direction and a handle extending outward therefrom along a radius direction. The ear portions are at a height substantially different from the handle.

22 Claims, 5 Drawing Sheets

QUICK-DETACHABLE VALVE, SUBSTRATE CONTAINER PROVIDED WITH THE SAME, AND METHOD OF LOADING AND UNLOADING THE SAME

REFERENCE TO RELATED APPLICATIONS

The present application is based on, and claims priority from, Taiwan application number 110132649 filed Sep. 2, 2021, the disclosure of which is hereby incorporated by reference herein in its entirety.

BACKGROUND OF THE INVENTION

Field of the Invention

The present disclosure relates to valves applicable to substrate (for example, reticle) containers and, more particularly, to a quick-release valve, a method of mounting the quick-release valve on the substrate container, and a method of dismounting the quick-release valve from the substrate container.

Description of the Prior Art

Optical lithography involves patterning a well-designed circuit on a light-penetrable reticle and then optically projecting the pattern on the reticle to a wafer, so as to expose and develop a specific pattern on the wafer. During an optical lithography process, any particles attached to the reticle are likely to deteriorate the quality of projection and imaging. In recent years, process miniaturization paves the way for development of smaller chips with higher logical density, and thus the wavelength for use in lithographic equipment has already fallen within the range of extreme ultraviolet (EUV). As a result, optical lithography processes nowadays set strict requirements on the amount of particles attached to reticles and the diameter of the particles, leading to strict requirement for cleanliness in reticle containers.

One of the existing techniques of maintaining the cleanliness in reticle containers entails providing a reticle container with inflation valves and maintaining the cleanliness in the reticle containers by feeding a gas thereto. In practice, for instance, the aforesaid technique involves changing the gas in a reticle container frequently through inflation valves at a specific flow rate to optimize the environment of reticle storage. The reticle container has filters disposed with the inflation valves and adapted to filter out particles from the gas. After a specific number of usage, the filters have to be changed in order to maintain the effect of filtration.

In a conventional reticle container, filters, inflation valves or any other elements are fastened and coupled to a base of the reticle container with screws. To change the aforesaid elements, for example, the filters, it is necessary to remove the screws in sequence and then remove a bottom plate of the base. Replacing the filters is followed by mounting the bottom plate in place and then tightening the screws in sequence. The aforesaid process of mounting the bottom plate and tightening the screws is time-consuming, thereby resulting in low efficient replacement of the filters or any other required elements.

SUMMARY OF THE INVENTION

It is an objective of the present disclosure to provide a quick-release valve, adapted for a substrate container with a cover plate and a bottom plate. The quick-release valve comprises: a quick-release member having a collar, the collar having an inner diameter and being detachably coupled to an opening of the bottom plate; a sleeve having a flow passage for allowing a gas to enter or exit the substrate container, wherein the sleeve has an outer diameter at least greater than the inner diameter of the collar; and a valve disposed in the flow passage to restrict flowing direction of the gas. The collar has a pair of ear portions extending outward therefrom along a diameter direction and a handle extending outward therefrom along a radius direction, with the ear portions being at a height substantially different from the handle.

In a specific embodiment, the diameter direction and the radius direction are not parallel.

In a specific embodiment, the collar has an outer side and an inner side. The pair of ear portions are proximate to the inner side of the collar. The handle is proximate to the outer side of the collar.

In a specific embodiment, the pair of ear portions each have a lower surface for pushing against an inner side of the bottom plate or an inner rim of the opening.

In a specific embodiment, the handle has an upper surface for pushing against the bottom plate.

In a specific embodiment, the pair of ear portions each have a lower surface, and the handle has an upper surface, allowing the lower surfaces of the pair of ear portions to push against an inner side of the bottom plate or an inner rim of the opening and the upper surface of the handle to push against an outer side of the bottom plate as soon as the quick-release member is coupled to the opening.

In a specific embodiment, the ear portions and the handle of the collar are configured to move relative to the opening between a first position and a second position.

Another objective of the present disclosure is to provide a substrate container. The substrate container comprises a base. The base comprises a cover plate and a bottom plate. The bottom plate has an inner side and an outer side. At least one opening extending between the inner side and the outer side is formed on the bottom plate and adapted for receiving a quick-release valve. The quick-release valve comprises: a quick-release member having a collar; a sleeve having a flow passage for allowing a gas to enter or exit the substrate container; and a valve disposed in the flow passage to restrict flowing direction of the gas. The collar has a pair of ear portions extending outward therefrom along a diameter direction and a handle extending outward therefrom along a radius direction. When the quick-release member is coupled to the opening, the handle is on the outer side of the bottom plate, whereas the pair of ear portions are on the inner side of the bottom plate, thereby allowing the collar to prevent the sleeve detached from the opening.

In a specific embodiment, the opening comprises a central channel and two matched channels beside the central channel, the central channel corresponds in shape to the collar, the matched channels correspond in shape to the pair of ear portions, thereby allowing the collar and the ear portions of the quick-release member to enter the opening.

In a specific embodiment, the opening comprises at least one groove formed on the outer side of the bottom plate and adapted for containing the handle of the collar when the collar is coupled to the opening of the bottom plate.

In a specific embodiment, the groove of the opening restricts movement of the handle between a first position and a second position, thereby allowing the collar to be at a loosened position when the handle is at the first position and the collar to be at a locked position when the handle is at the second position.

In a specific embodiment, the groove is defined by a slide surface, and the slide surface is parallel to the outer side of the bottom plate, thereby allowing the handle of the collar to come into contact with the slide surface and the handle to slide across the slide surface when the collar is coupled to the opening.

In a specific embodiment, when the handle is in contact with the slide surface of the bottom plate, the lower surfaces of the pair of ear portions are flush with an inner side of the bottom plate or above the inner side of the bottom plate.

In a specific embodiment, the pair of ear portions enters and exits the opening freely when the collar is at the loosened position, and the pair of ear portions lies on the inner side of the bottom plate and pushes against the inner side of the bottom plate when the collar is at the locked position, such that the collar is firmly coupled to the opening.

Yet another objective of the present disclosure is to provide a method for mounting a quick-release valve, adapted for mounting at least one quick-release valve on a substrate container, the quick-release valve comprising a quick-release member with a collar, a sleeve with a flow passage, and a valve, the collar having a pair of ear portions extending outward therefrom along a diameter direction and a handle extending outward therefrom along a radius direction, the substrate container comprising a base, the base having a cover plate and a bottom plate, the bottom plate having at least one opening formed thereon, the cover plate having a fitting portion corresponding in position to the opening, the mounting method comprising the steps of: placing the valve in the flow passage of the sleeve; connecting the sleeve to the fitting portion to form a hermetic seal between the sleeve and an inner side of the fitting portion; and passing the pair of ear portions through the opening to allow the handle to be movably in contact with an outer side of the bottom plate and allow the pair of ear portions to be on an inner side of the bottom plate, so as to prevent the sleeve detached from the opening.

In a specific embodiment, the opening comprises a central channel and two matched channels beside the central channel, the central channel corresponds in shape to the collar, the matched channels correspond in shape to the pair of ear portions, thereby allowing the collar and the ear portions of the quick-release member to enter the opening.

In a specific embodiment, the opening comprises at least one groove disposed on the outer side of the bottom plate and configured to receive the handle of the collar when the collar is coupled to the opening of the bottom plate.

In a specific embodiment, after the pair of ear portions passes through the opening, moving the handle relative to the opening from a first position to a second position, such that the quick-release member switches from a loosened position to a locked position, and the pair of ear portions is positioned on the inner side of the bottom plate when the quick-release member is at the locked position.

In a specific embodiment, the groove restricts movement of the handle of the collar coupled to the opening between a first position and a second position in the groove, such that the quick-release member is switched from a loosened position to a locked position when the handle moves from the first position to the second position, and the locked position prevents the sleeve detached from the opening.

Still yet another objective of the present disclosure is to provide a method for dismounting a quick-release valve, adapted for removing the mounted quick-release valve by the foregoing mounting method from the opening, the dismounting method comprising the steps of: moving the handle to allow the pair of ear portions to switch from a locked position to a loosened position, thereby allowing the pair of ear portions at the loosened position to enter and exit the opening freely; removing the quick-release member from the opening, such that the collar does not restrict the sleeve; and removing the sleeve from the opening.

In a specific embodiment, the loosened position allows the pair of ear portions to enter and exit freely matched channels in the opening, respectively, and the matched channels correspond in shape to the ear portions.

In a specific embodiment, the step of moving the handle includes moving the handle within at least one groove of the opening so as to synchronously move the handle, the collar and the ear portions.

BRIEF DESCRIPTION OF THE DRAWINGS

The present disclosure is depicted by drawings, illustrated by non-restrictive, non-exhaustive embodiments, and described below. The drawings are not drawn to scale but are aimed at disclosing the structural features and principles of the present disclosure.

DETAILED DESCRIPTION OF THE EMBODIMENTS

The present disclosure is depicted by accompanying drawings, illustrated by specific embodiments, and described below. However, the subject matters claimed by the present disclosure can be specifically implemented in various ways; hence, the scope of the claims of the present disclosure is not restricted to the illustrative, specific embodiments described herein but is reasonably broad.

The technical terms used in explaining "an embodiment" disclosed herein are not necessarily applied to a same embodiment disclosed herein. The so-called "a variant embodiment" and "another embodiment" disclosed herein are not necessarily applied to the other specific embodiments disclosed herein. The subject matters claimed by the present disclosure are each defined and illustrated, in whole or in part, by the combination of all the specific embodiments disclosed herein.

Figure 1:
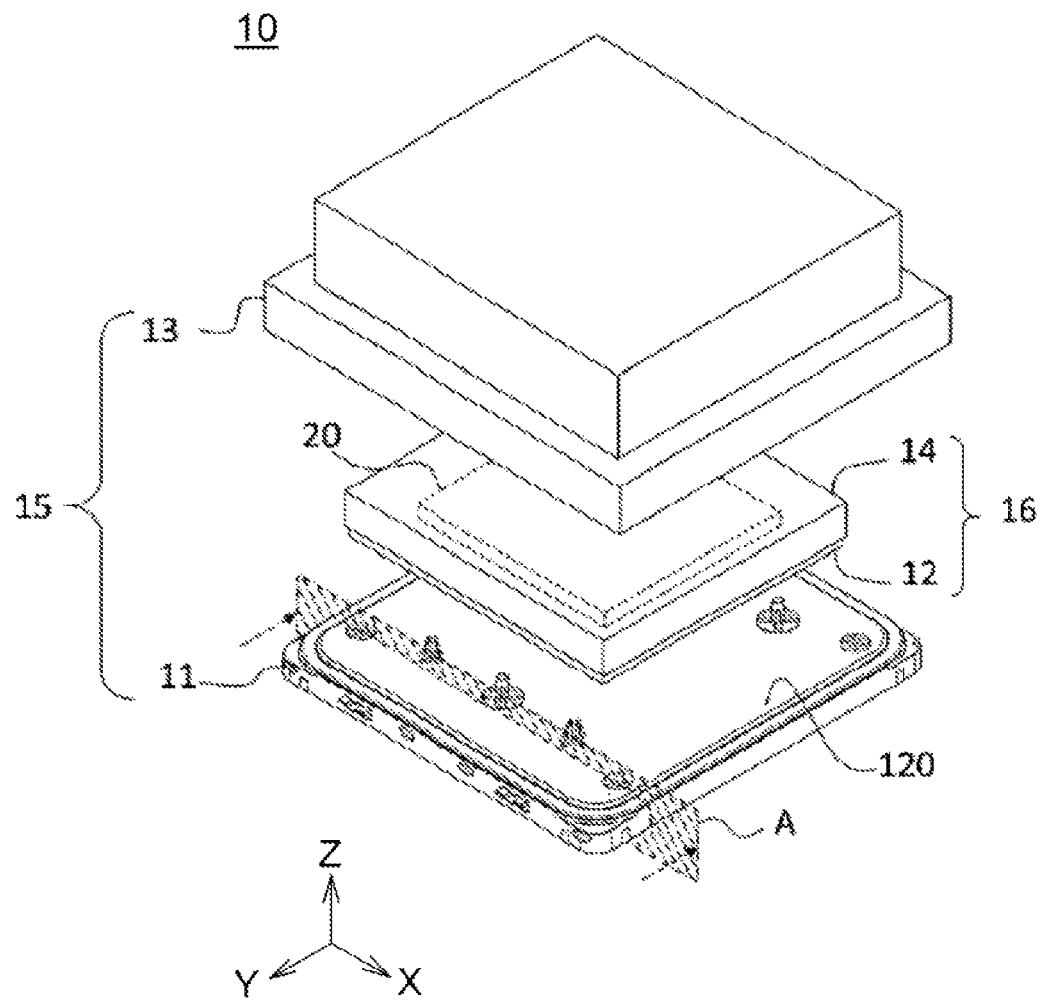
FIG. 1 is a three-dimensional exploded view of a substrate container.

FIG. 1 is a schematic view of a substrate container according to an embodiment of the present disclosure. A substrate container (10) comprises an outer case assembly (15) and an inner case assembly (16). The outer case assembly (15) receives the inner case assembly (16). The inner case assembly (16) receives a substrate (20) therein. The outer case assembly (15) comprises a base (11) and an upper cover (13). The upper cover (13) and the base (11) engage with each other to form therebetween a hermetic seal for separating the exterior and the interior of the outer case assembly (15), thereby allowing the interior of the outer case assembly (15) to meet the cleanliness requirement of a specific semiconductor process. The inner case assembly (16) comprises a base (12) and an upper cover (14) which operate in conjunction with each other. The base (12) and the upper cover (14) engage with each other to form therebetween a receiving space for receiving the substrate (20). In this embodiment, the substrate (20) is, for example, an extreme ultraviolet (EUV) reticle adapted for a high-density semiconductor patterning process. However, in a variant embodiment, the substrate (20) can be any substrate related to a semiconductor process and meeting high cleanliness standards.

Figure 2:
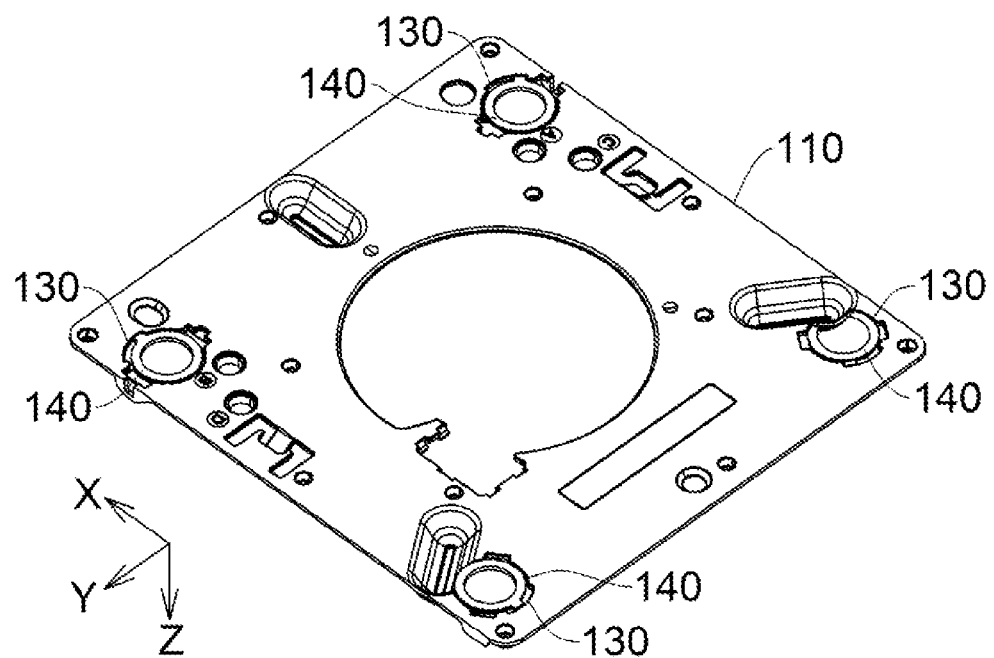
FIG. 2 is a perspective view of a bottom plate of the base of the substrate container and quick-release members disposed on the bottom plate.

Referring together with FIG. 2, the base (11) of the outer case assembly (15) has a cover plate (120) and a bottom plate (110). The cover plate (120) and the bottom plate (110) are detachably coupled together, so as for the base (11) to form therein an internal space large enough to contain a valve (shown in FIG. 5) and a fastening mechanism (not shown). The valve allows a gas to enter or exit the receiving space of the substrate container (10). In this embodiment, the bottom plate (110) can be provided with four quick-release valves, two of which allowing the gas to enter the substrate container (10), the other two allowing the gas to exit the substrate container (10), but the present disclosure is not limited thereto. Thus, quick-release valves in any other number can be arranged in any other ways and are still applicable to the present disclosure.

As shown in FIG. 2, a substantially round opening (130) is formed at each of the four corners of the bottom plate (110). The openings (130) are each configured to operate in conjunction with a quick-release member (140) of the present disclosure. The openings (130) are in communication with a receiving space of the base (11), such that the valve can be inserted into the base (11) through the openings (130). As shown in FIG. 1, openings (not numbered) are also formed on the cover plate (120) and correspond in position to the openings (130) of FIG. 2 in order to be in communication with one end of the valve. A filter (not shown) is disposed at any position between each opening (130) of the bottom plate (110) and the corresponding one of the openings of the cover plate (120). A substantially round opening is centrally formed on the bottom plate (110) and adapted for an operating portion (not shown in this figure) of the fastening mechanism. The fastening mechanism is used for locking the base (11) and the upper cover (13) together.

Figure 3:
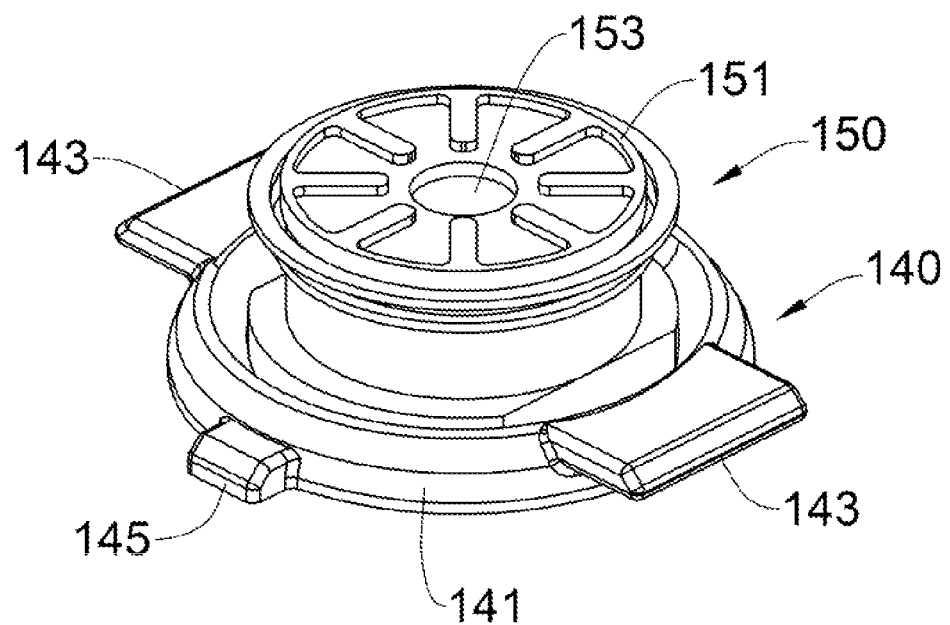
FIG. 3 is a perspective view of a quick-release member coupled to a sleeve according to the present disclosure.
Figure 4:
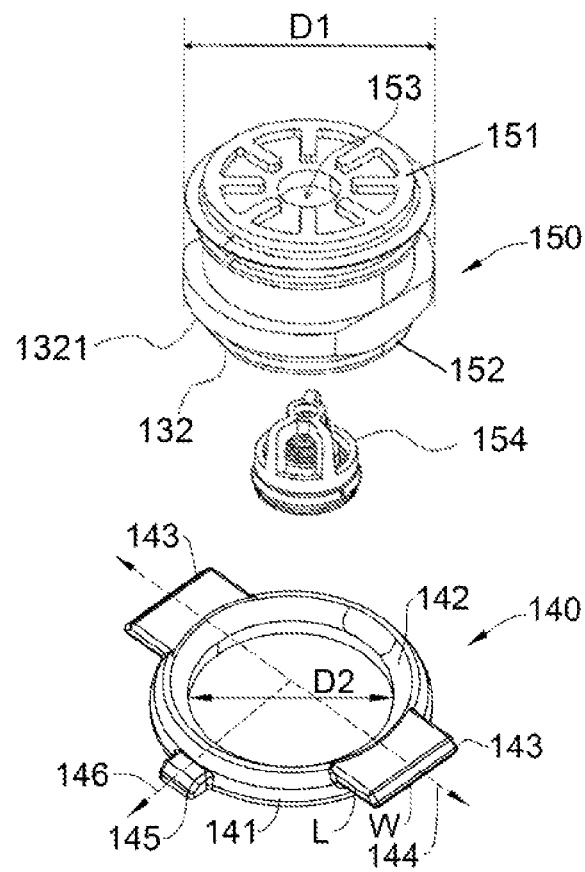
FIG. 4 is a longitudinal exploded view based on FIG. 3.
Figure 5:
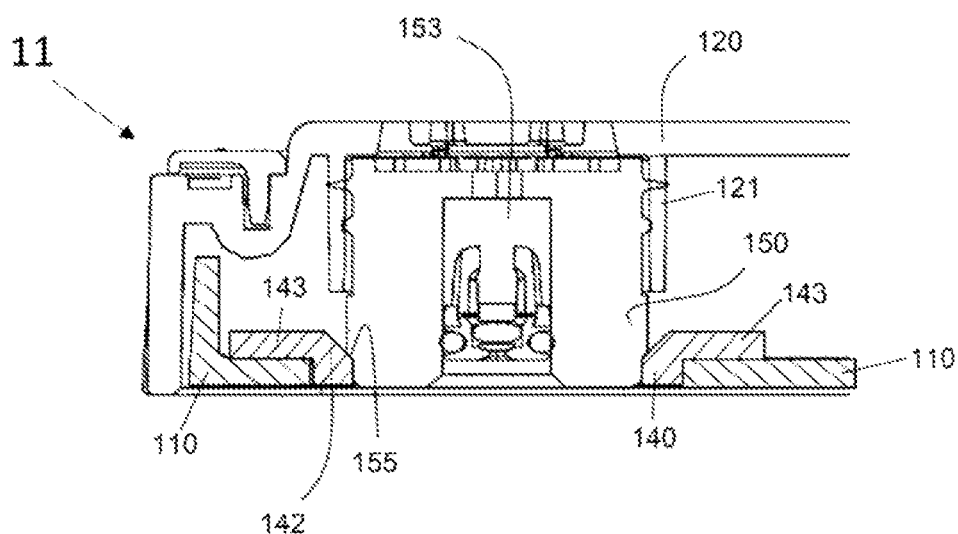
FIG. 5 is a cross-sectional view taken along plane A of FIG. 1.

FIG. 3 shows the quick-release member (140) coupled to a sleeve (150). FIG. 4 is a longitudinal exploded view based on FIG. 3. The sleeve (150) is in a cylindrical shape with an outer diameter (D1) and has a top end (151) and a bottom end (152). When the sleeve (150) is placed inside the base (11), as shown in FIG. 5, the top end (151) pushes against an inner side of the cover plate (120), while the bottom end (152) is proximate to the inner side of the bottom plate (110) and exposed through the opening (130) of FIG. 2. The top end (151) and the bottom end (152) of the sleeve (150) differ from each other slightly in terms of structure. The top end (151) is designed to match the inner side of the cover plate (120) and thus prevent air in the base (11) from leaking out of the cover plate (120). The bottom end (152) is designed to match the quick-release member (140) and thus allow the quick-release member (140) to hold the bottom end (152) and rotate relative to the bottom end (152).

The sleeve (150) has a flow passage (153) for allowing a gas to enter or exit the receiving space of the substrate container. A valve (154) is disposed in the flow passage (153) to restrict flowing direction of the gas.

The quick-release member (140) is generally a collar (141) able to engage with the sleeve (150) and having an inner diameter (D2). The inner diameter (D2) is less than the outer diameter (D1) of the sleeve (150), such that the sleeve (150) cannot pass through the collar (140). An annular ramp (142) is formed on the inner side of the collar (140) and adapted for contacting with the bottom end (152) of the sleeve (150). Likewise, a shoulder portion (155) is formed at the bottom end (152) of the sleeve (150) and adapted for matching the annular ramp (142) of the collar (140), as shown in FIG. 5.

The quick-release member (140) further has a pair of ear portions (143) extending outward from the outer side of the collar (141) and laterally along a diameter direction (144). The pair of ear portions (143) are panel-shaped and extend outward from the collar (141) by a length (L) and a width (W). A lower surface of each ear portion (143) touches against an inner side of the bottom plate (110) (as shown in FIG. 5) or an inner rim of the opening (130) when the quick-release valve is mounted on the base (11).

Figure 8:
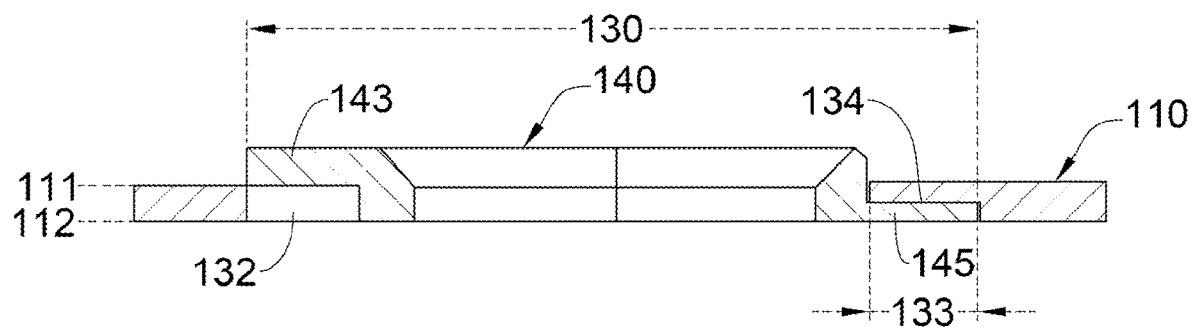
FIG. 8 is a cross-sectional view showing the connection of the quick-release member and the bottom plate taken along line BB of FIG. 6 according to the present disclosure.

The quick-release member (140) further has a handle (145) extending outward from the outer side of the collar (141) and laterally along a radius direction (146). The radius direction (146) is different from the diameter direction (144), such that the handle (145) is disposed between the pair of ear portions (143). Furthermore, the handle (145) and ear portions (143) are located at different vertical positions, respectively. As shown in FIG. 3, the pair of ear portions (143) are connected to an upper edge of the collar (141), while the handle (145) is located at a lower edge of the collar (141). An upper surface of the handle (145) is in contact with an outer side of the bottom plate (110) (as shown in FIG. 8) when the quick-release valve is mounted on the base (11). The collar (141), the ear portions (143) and the handle (145) are integrally formed.

FIG. 5 is a cross-sectional view according to the plane A of FIG. 1 and shows that the quick-release valve is mounted in the receiving space between the cover plate (120) and the bottom plate (110) with the quick-release member (140) located at a locked position. The upper half of the sleeve (150) is received in a fitting portion (121) on the inner side of the cover plate (120). A hermetic seal ring is formed on the circumferential surface of the sleeve (150) and adapted to be in contact with the inner wall of the fitting portion (121), such that gas cannot leak to the outside of the cover plate (120) through the gap between the fitting portion (121) and the circumferential surface of the sleeve (150).

When the quick-release member (140) is coupled to the bottom plate (110) and located at the locked position, the annular ramp (142) touches against the shoulder portion (155) of the sleeve (150), while the lower surfaces of the ear portions (143) touches against the inner side of the bottom plate (110), such that the sleeve (150) is confined between the cover plate (120) and the bottom plate (110), so as to prevent escape of the sleeve (150) from the opening of the bottom plate (110).

Figure 6:
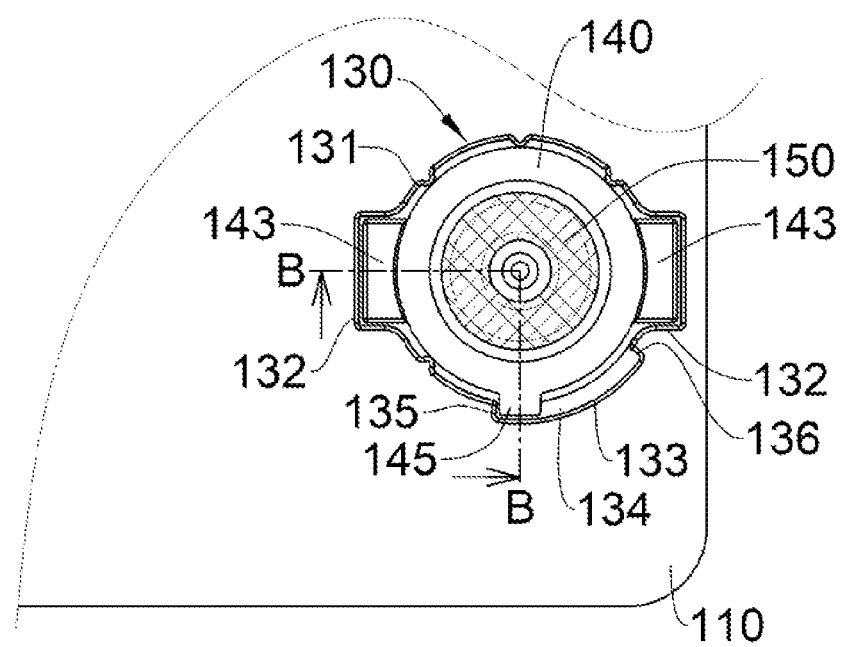
FIG. 6 is a schematic view of the quick-release member located at a loosened position relative to the bottom plate according to the present disclosure.
Figure 7:
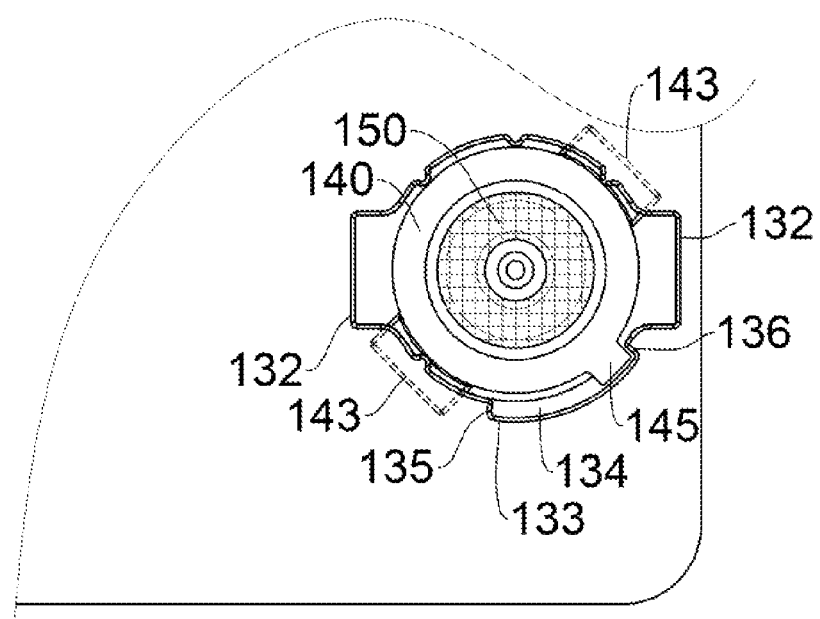
FIG. 7 is a schematic view of the quick-release member located at a locked position relative to the bottom plate according to the present disclosure.

FIG. 6 shows that the quick-release member (140) is located at a loosened position relative to the bottom plate (110). FIG. 7 shows that the quick-release member (140) is located at a locked position relative to the bottom plate (110). As shown in FIG. 2, the bottom plate (110) has a plurality of openings (130). FIG. 6 and FIG. 7 each show one of the openings (130). The openings (130) extend from the inner side (which defines the receiving space) of the bottom plate (110) to the outer side (which faces the periphery of the outer case component) of the bottom plate (110) and are of a shape permitting the sleeve (150) and the quick-release member (140) entering therein.

The openings (130) each comprise a central channel (131) and two matched channels (132). According to the view of FIG. 6 and FIG. 7, the central channel (131) is generally a round shape whose diameter is slightly greater than the outer diameter (D1) of the sleeve (150) and the outer diameter of the collar (141) of the quick-release member (140); thus, not only can the sleeve (150) and the quick-release member (140) enter and exit the openings (130) freely, but the quick-release member (140) can also rotate freely when positioned in the central channel (131). The matched channels (132) extend outward from the periphery of the central channel (131). According to the view of FIG. 6 and FIG. 7, the matched channels (132) substantially correspond in shape to the ear portions (143) of the quick-release member (140), such that the quick-release member (140) can enter and exit the opening (130) freely only when the ear portions (143) are aligned with the matched channels (132). Therefore, the quick-release member (140) is able to enter and exit the opening (130) freely only in a specific orientation.

The openings (130) each further comprise a groove (133) disposed beside the central channel (131) and between the matched channels (132). The groove (133) sinks below the outer side of the bottom plate (110) slightly and is defined by a curved wall (not denoted by any reference numeral) of the bottom plate (110) and a slide surface (134). The slide surface (134) is parallel to the outer side of the bottom plate (110). When the quick-release member (140) is positioned in the central channel (131), the handle (145) is received in the groove (133) and slidable across the slide surface (134) between a first block surface (135) defining a first position and a second block surface (136) defining a second position of the groove (133). As such, the handle (145) is slidable between the first position defined by the first block surface (135) and the second position defined by the second block surface (136), thereby allowing the collar (141) to be at a loosened position when the handle (145) is at the first position and the collar (141) to be at a locked position when the handle (145) is at the second position.

FIG. 8 is a cross-sectional view based on the line BB of FIG. 6 according to the present disclosure. As shown in the diagram, when the quick-release member (140) is located at the loosened position and received in the opening (130), the handle (145) is substantially positioned on an outer side (112) of the bottom plate (110) and touches against the slide surface (134) of the groove (133), while one of the ear portions (143) is substantially positioned above an inner side (111) of the bottom plate (110). The lower surfaces of the ear portions (143) are flush with the inner side (111) or slightly higher than the inner side (111); thus, when the quick-release member (140) rotates to the locked position shown in FIG. 7, the ear portions (143) can move freely on the inner side of the bottom plate (110).

When the handle (145) is in contact with the first stop position (135), the quick-release member (140) is not locked at the bottom plate (110). When the handle (145) is in contact with the second stop position (136), as shown in FIG. 7, the pair of ear portions (143) indicated by dashed lines are on the inner side of the bottom plate (110) whereby keeping the ear portions (143) from escaping the openings (130). As shown in FIG. 5, the quick-release member (140) is at the locked position, and thus the top end and the bottom end of the sleeve (150) touch against the inner side of the fitting portion (121) and the inner side of the cover plate (120) and an annular ramp (142) of the quick-release member (140), respectively, whereas the ear portions (143) of the quick-release member (140) push against the inner side of the bottom plate (110), such that the sleeve (150) is firmly coupled to the base (11). The bottom of the sleeve (150) is in resilient contact with the quick-release member (140), such that the ear portions (143) of the quick-release member (140) at the locked position are pressed against the inner side of the bottom plate (110). At this point, friction prevents the quick-release member (140) from moving to the loosened position.

Referring to FIG. 8, preferably, regarding the depth of the groove (133), the vertical distance between the slide surface (134) and the outer side (112) of the bottom plate (110) must at least allow the handle (145) to be flush with the outer side (112) of the bottom plate (110). Alternatively, the handle (145) has to be completely received in the groove (133), so that the handle (145) can avoid collision when the base (11) is in contact with a ground plane.

In a feasible embodiment, the slide surface can be disregard, which means the groove (133) is defined only by the first block surface (135), the second block surface (136) and the curved wall.

Figure 9:
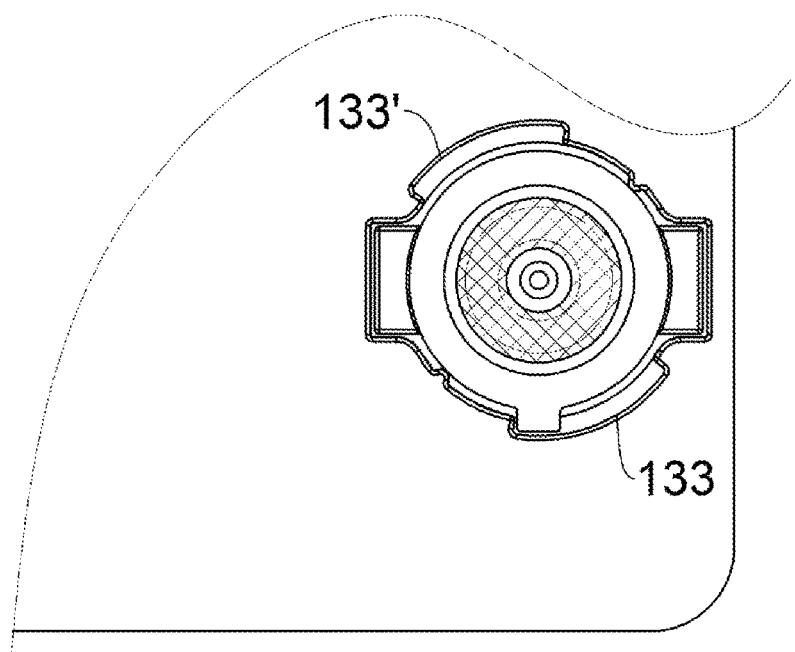
FIG. 9 is a schematic view of the bottom plate in another embodiment of the present disclosure.

FIG. 9 shows another embodiment of the present disclosure. The technical feature which distinguishes this embodiment from the preceding embodiment is that, in this embodiment, the opening (130) has one more groove, i.e., groove (133'), to thereby enhance the ease of aligning the quick-release member (140) with the opening (130).

According to the present disclosure, to mount the quick-release valve of the present disclosure on the base (11) without the valve, the sleeve (150) with the valve (154) inserted therein is positioned in a correct direction and then coupled to the fitting portion (121) of the cover plate (120) to enable airtight contact between an outer side of the sleeve (150) and an inner side of the fitting portion (121). The sleeve (150) is mounted in place together with a filter. Then, the bottom plate (110) and the cover plate (120) are fitted together to form the base (11). The quick-release member (140) is positioned in a correct direction in order to enter the opening (130) of the bottom plate (110). The correct direction is the direction required to align the collar (141) with the central channel (131) and align the pair of ear portions (143) with the matched channels (132). When the quick-release member (140) is aligned with the opening (130), the quick-release member (140) is passed through the opening (130) to hold and press the bottom end (152) of the sleeve (150) until the ear portions (143) completely lie on the inner side of the bottom plate (110) and until the handle (145) is received in the groove (133). After that, the handle (145) is operated to cause the quick-release member (140) to rotate within the opening (130) and cause the ear portions (143) to synchronously rotate until they come into contact with the inner side of the bottom plate (110), i.e. the loosened position in FIG. 6 is switched to the locked position in FIG. 7.

To change the filter of the valve in the base (11), the quick-release member (140) is switched from the locked position as shown in FIG. 7 to the loosened position as shown in FIG. 6 by the handle (145). As soon as the ear portions (143) are no longer in contact with the inner side of the bottom plate (110), the bottom end (152) of the sleeve (150) presses the quick-release member (140) downward, such that the quick-release member (140) places no restriction on the sleeve (150). After the quick-release member (140) has been removed from the opening (130), the sleeve (150) is removed from the base (11) with a tool. Alternatively, separation of the bottom plate (110) and the cover plate (120) is followed by removal of the sleeve (150), such that the filter can be changed.

In conclusion, the aforesaid embodiments of the present disclosure provide a quick-release valve, a substrate container having the quick-release valve, and methods of mounting and dismounting the quick-release valve. When a quick-release member of the quick-release valve is at a locked position relative to a bottom plate, the quick-release member holds a sleeve and thus prevents separation of the sleeve from a base. When the quick-release member is at a loosened position relative to the bottom plate, the sleeve separates from the base. With the quick-release member being dismountable, the quick-release valve can be changed conveniently and quickly to enhance working efficiency.

What is claimed is:

1. A quick-release valve, adapted for a substrate container, the substrate container having a cover plate and a bottom plate, the quick-release valve comprising:
    a quick-release member having a collar, the collar having an inner diameter and being detachably coupled to an opening of the bottom plate;
    a sleeve having a flow passage for allowing a gas to enter or exit the substrate container, wherein the sleeve has an outer diameter at least greater than the inner diameter of the collar; and
    a valve disposed in the flow passage to restrict flowing direction of the gas,
    wherein the collar has a pair of ear portions extending outward therefrom along a diameter direction and a handle extending outward therefrom along a radius direction, with the ear portions being at a height substantially different from the handle.

2. The quick-release valve of claim 1, wherein the diameter direction and the radius direction are not parallel.

3. The quick-release valve of claim 1, wherein the collar has an outer side and an inner side, the handle is relatively adjacent to the outer side of the collar and the pair of ear portions are relatively adjacent to the inner side of the collar.

4. The quick-release valve of claim 1, wherein the pair of ear portions each have a lower surface for pushing against an inner side of the bottom plate or an inner rim of the opening.

5. The quick-release valve of claim 1, wherein the handle has an upper surface for pushing against the bottom plate.

6. The quick-release valve of claim 1, wherein the pair of ear portions each have a lower surface, and the handle has an upper surface, allowing the lower surfaces of the pair of ear portions to push against an inner side of the bottom plate or an inner rim of the opening and the upper surface of the handle to push against the bottom plate as soon as the quick-release member is coupled to the opening.

7. The quick-release valve of claim 1, wherein the ear portions and the handle of the collar are configured to move relative to the opening between a first position and a second position.

8. A substrate container comprising a base, the base comprising a cover plate and a bottom plate, the bottom plate having an inner side and an outer side, wherein the bottom plate has at least one opening formed and extending from the inner side to the outer side thereof and adapted for receiving a quick-release valve, the quick-release valve comprising:
    a quick-release member having a collar;
    a sleeve having a flow passage for allowing a gas to enter or exit the substrate container; and
    a valve disposed in the flow passage to restrict flowing direction of the gas,
    wherein the collar has a pair of ear portions extending outward therefrom along a diameter direction and a handle extending outward therefrom along a radius direction, when the quick-release member is coupled to the opening, the handle is on the outer side of the bottom plate, whereas the pair of ear portions are on the inner side of the bottom plate, thereby allowing the collar to prevent the sleeve detached from the opening.

9. The substrate container of claim 8, wherein the opening comprises a central channel and two matched channels beside the central channel, the central channel corresponds to the collar in shape, the matched channels correspond to the pair of ear portions in shape, thereby allowing the collar and the pair of ear portions of the quick-release member to enter the opening.

10. The substrate container of claim 9, wherein the opening further comprises at least one groove formed on the outer side of the bottom plate and adapted for containing the handle of the collar when the collar is coupled to the opening of the bottom plate.

11. The substrate container of claim 10, wherein the groove of the opening restricts movement of the handle between a first position and a second position, thereby allowing the collar to be at a loosened position when the handle is at the first position and the collar to be at a locked position when the handle is at the second position.

12. The substrate container of claim 10, wherein the groove is defined by a slide surface, and the slide surface is parallel to the outer side of the bottom plate, thereby allowing the handle of the collar to come into contact with the slide surface and the handle to slide across the slide surface when the collar is coupled to the opening.

13. The substrate container of claim 12, wherein, when the handle is in contact with the slide surface of the bottom plate, the lower surfaces of the pair of ear portions are flush with an inner side of the bottom plate or above the inner side of the bottom plate.

14. The substrate container of claim 11, wherein the pair of ear portions enters and exits the opening freely when the collar is at the loosened position, and the pair of ear portions lies on the inner side of the bottom plate and pushes against the inner side of the bottom plate when the collar is at the locked position, such that the collar is firmly coupled to the opening.

15. A method for mounting a quick-release valve, adapted for mounting at least one quick-release valve on a substrate container, the quick-release valve comprising a quick-release member having a collar, a sleeve with a flow passage, and a valve, the collar having a pair of ear portions extending outward therefrom along a diameter direction and a handle extending outward therefrom along a radius direction, the substrate container comprising a base, the base having a cover plate and a bottom plate, the bottom plate having at least one opening formed thereon, the cover plate having a fitting portion corresponding in position to the opening, the mounting method comprising the steps of:
    placing the valve in the flow passage of the sleeve;
    connecting the sleeve to the fitting portion to form a hermetic seal between the sleeve and an inner side of the fitting portion; and
    passing the pair of ear portions through the opening to allow the handle to be movably in contact with an outer side of the bottom plate and allow the pair of ear portions to be on an inner side of the bottom plate, so as to prevent the sleeve detached from the opening.

16. The mounting method of claim 15, wherein the opening comprises a central channel and two matched channels beside the central channel, the central channel corresponds to the collar in shape, the matched channels correspond to the pair of ear portions in shape, thereby allowing the collar and the ear portions of the quick-release member to enter the opening.

17. The mounting method of claim 15, wherein the opening comprises at least one groove disposed on the outer side of the bottom plate and configured to receive the handle of the collar when the collar is coupled to the opening of the bottom plate.

18. The mounting method of claim 16, wherein, after the pair of ear portions passes through the opening, moving the handle relative to the opening from a first position to a second position, such that the quick-release member switches from a loosened position to a locked position, and the pair of ear portions is positioned on the inner side of the bottom plate when the quick-release member is at the locked position.

19. The mounting method of claim 17, wherein the groove restricts movement of the handle of the collar coupled to the opening between a first position and a second position in the groove, such that the quick-release member is switched from a loosened position to a locked position when the handle moves from the first position to the second position, and the locked position prevents the sleeve detached from the opening.

20. A method for dismounting a quick-release valve, adapted for removing the mounted quick-release valve of claim 15 from the opening, the dismounting method comprising the steps of:
  moving the handle to allow the pair of ear portions to switch from a locked position to a loosened position, thereby allowing the pair of ear portions at the loosened position to enter and exit the opening freely;
  removing the quick-release member from the opening, such that the collar does not restrict the sleeve; and
  removing the sleeve from the opening.

21. The dismounting method of claim 20, wherein the loosened position allows the pair of ear portions to enter and exit freely matched channels in the opening, respectively, and the matched channels correspond in shape to the ear portions.

22. The dismounting method of claim 20, wherein the step of moving the handle includes moving the handle within at least one groove of the opening so as to synchronously move the handle, the collar and the ear portions.

* * * * *